United States Patent [19]

Yu

[11] Patent Number: 5,281,557
[45] Date of Patent: Jan. 25, 1994

[54] SOLUBLE OXIDES FOR INTEGRATED CIRCUIT FABRICATION FORMED BY THE INCOMPLETE DISSOCIATION OF THE PRECURSOR GAS

[75] Inventor: Chen-Hua D. Yu, Allentown, Pa.

[73] Assignee: AT&T Bell Laboratories, Murray Hill, N.J.

[21] Appl. No.: 52,803

[22] Filed: Apr. 22, 1993

Related U.S. Application Data

[63] Continuation of Ser. No. 561,768, Aug. 2, 1990, abandoned.

[51] Int. Cl.$^5$ .................... H01L 21/00; H01L 21/02
[52] U.S. Cl. .................... 437/235; 437/238; 437/240; 148/DIG. 118
[58] Field of Search .................... 437/225, 228, 235; 427/569, 574; 118/50.1, 620; 156/345, 643

[56] References Cited

U.S. PATENT DOCUMENTS

| | | | |
|---|---|---|---|
| 4,282,268 | 8/1981 | Priestley et al. | 427/39 |
| 4,832,779 | 5/1989 | Fisher et al. | 156/654 |
| 4,872,947 | 10/1989 | Wang et al. | 156/643 |
| 4,877,641 | 10/1989 | Dory | 427/38 |
| 4,892,753 | 1/1990 | Wang et al. | 427/38 |

OTHER PUBLICATIONS

C. S. Pai and C. P. Chang; Downstream Microwave Plasma-Enhanced Chemical Vapor Deposition of Oxide Using Tetraethoxysilane Journal of Applied Physics, vol. 68, No. 2, Jul. 15, 1990, pp. 793–801.
S. Nguyen et al.; Reaction Mechanisms of Plasma-and Thermal-Assisted Chemical Vapor Deposition of Tetraethylorthosilicate Oxide; pp. 2209–2215, Electrochemical Society, Inc., vol. 137, No. 7, Jul. 1990.
Lu, Chih-Yuan et al., IEEE Electron Device Letters, vol. 10, No. 11, Nov. 1989, Submicrometer Salicide CMOS Devices with Self-Aligned Shallow/Deep Junctions, pp. 487–489.
Hieber, K. et al., Chemical Vapour Deposition of Oxide and Metal Films for VLSI Applications, pp. 75–84, Thin Solid Films, 181, Dec. 10, No. 1, Lausanne, Ohio.
Yu, D. C. H. et al., Highly Soluble PECVD-Oxide Films . . . Extended Abstracts 1046b, Spring Meeting, Quebec, May 6–11, 1990, pp. 195–196.
IBM Technical Disclosure Bulletin, May 30, 1988, No. 12, vol. 30, Armonk, N.Y., pp. 180–181.
Sze, Silicon Processing for the VLSI Era, vol. 1, Lattice Press, 1986, pp. 532–534.

*Primary Examiner*—Tom Thomas
*Assistant Examiner*—B. Everhart
*Attorney, Agent, or Firm*—John T. Rehberg; David L. Smith

[57] ABSTRACT

In the manufacture of integrated circuits, a process for forming a dielectric layer such as silicon dioxide which has a high wet etch rate is disclosed. Illustratively, the process is performed with a precursor gas in a plasma reactor with a shower head and a susceptor which supports a wafer. The power density, pressure, susceptor-shower head spacing, and (optionally) temperature are respectively decreased, decreased, increased and decreased to reduce the effectiveness of dissociation of the precursor gas. The resulting film contains impurities which enhance its wet etch rate.

26 Claims, 1 Drawing Sheet

SOLUBLE OXIDES FOR INTEGRATED CIRCUIT FABRICATION FORMED BY THE INCOMPLETE DISSOCIATION OF THE PRECURSOR GAS

This application is a continuation of application Ser. No. 07/561768, filed on Aug. 2, 1990, now abandoned.

TECHNICAL FIELD

This invention relates generally to integrated circuits and, more particularly, to methods for forming highly soluble oxide layers and features in connection with the fabrication of integrated circuits.

BACKGROUND OF THE INVENTION

Modern integrated circuit manufacturing processes occasionally require the formation of two layers or structures of similar material and the subsequent removal of one of these layers or structures. For example, in various circumstances it may be desirable to form an initial silicon dioxide layer and subsequently form a second silicon dioxide layer upon the first layer. Later it may be desirable to preferentially etch the second layer without risk of substantial damage to the first layer.

Under other circumstances, it may be desirable to form two spacers, each spacer being made from generally silicon dioxide, and then etch (often in a wet solution) one of the spacers away. The spacer which is etched away is often termed a "disposable spacer."

Often spacers are formed by chemical vapor deposition processes in which a precursor gas is decomposed to produce the desired material layer.

In each of the above circumstances, it is desired to form two layers, generally composed of silicon dioxide, one of the layers having a high wet etch rate, good step coverage (in spacer applications) and acceptable formation rates in a production environment. The other layer should desirably have a lower wet etch rate.

SUMMARY OF THE INVENTION

The present invention includes a method of fabrication which includes the formation of two material layers, the second layer having sufficient impurities so that it has a higher etch rate than the first.

Thus, illustratively, the second layer may be a silicon oxide layer formed by a precursor gas which is incompletely dissociated. A spacer formed, for example, from the second layer exhibits a higher etch rate than spacers or layers formed by more conventional processes.

DETAILED DESCRIPTION

Figure 1:
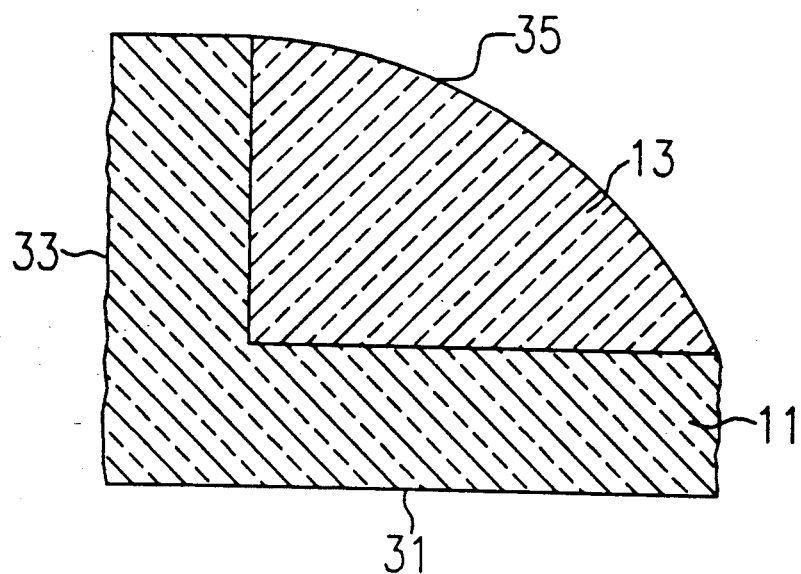
FIGS. 1, 2, and 3 are cross-sectional views depicting structures which may, illustratively, be formed by the present invention.
Figure 2:
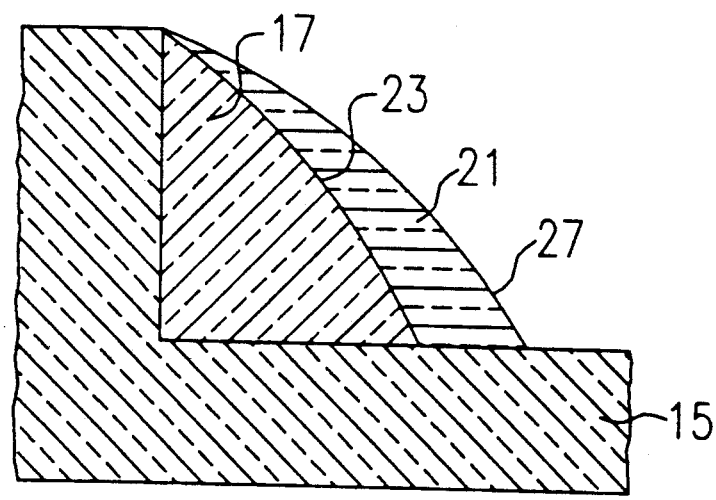
Figure 3:
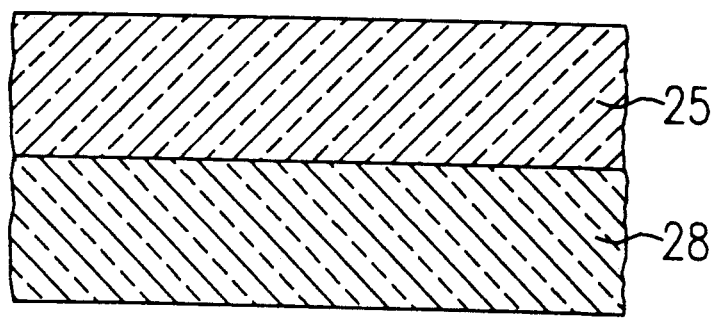

FIGS. 1, 2 and 3 are illustrative of some of the structures which may be formed by the technique of the present invention. In FIG. 1, reference numeral 11 denotes a material which is, illustratively, silicon dioxide. Layer 11 may be formed, for example, by the decomposition of TEOS (tetraethylorthosilane) in a reactor. Layer 11 has generally an "L" shape. The bottom surface of layer 11 may contact a substrate such as silicon or another material. Surface 33 may abut some raised topographic feature, for example, a gate stack, a runner, etc. Alternatively, layer 11 need not necessarily be silicon dioxide—it may be, for example, silicon nitride, or amorphous silicon or polysilicon.

Spacer 13 may, illustratively, also be formed in the same or similar reactor as layer 11 from the decomposition of TEOS. Generally speaking, spacer 13 is formed by depositing TEOS (in a manner to be described in more detail below) in a blanket layer and then anisotropically etching the blanket layer back to form spacer 13 with a characteristic curved outer surface profile 35.

An example of a double spacer arrangement somewhat analogous (albeit with perhaps different materials) to that depicted in FIG. 1 is provided in U.S. patent application Ser. No. 422,834, entitled "CMOS With Triple Layer Gate Spacer," filed Oct. 17, 1989, co-assigned herewith.

Another example of a dual spacer arrangement is provided in FIG. 2 where substrate 15 may, generally, be any material used in semiconductor fabrication. Curved spacer 17 may, illustratively, be formed from TEOS. As mentioned before, the curved profile of spacer 17 is formed by first performing a blanket deposition and then an anisotropic etchback. The curved outer surface 23 of spacer 17 is covered by spacer 21. Spacer 21 also has a curved outer surface 27. Spacer 21 is formed by a process similar to that used in forming spacers 17 and 13.

In both FIGS. 1 and 2, it is often desirable to have the outermost spacer (e.g., 21, 13) highly soluble in HF wet solutions such as 8:1 ethylene glycol buffered HF or 100:1 HF. Thus, in FIG. 1, it may be desirable to immerse the structure of FIG. 1 in a wet etch solution, removing spacer 13 while leaving spacer 11 intact. Similarly, in FIG. 2, it may be desirable to immerse the entire structure in a wet etching solution, removing spacer 21, while leaving spacer 17 and underlying structure 15 intact. Typically, it is desired that the etch rate of spacers 21 and 13 be 10 times higher than the etch rate of underlying spacers 17 and 11.

Furthermore, FIG. 3 contains another illustration of the applicability of the present invention. Layer 28 may be formed, for example, from TEOS, while layer 25 may also, illustratively, be formed from TEOS. However, it may be desirable that layer 25 have a substantially higher wet etch rate than layer 28.

The present invention, illustratively, provides a plasma-enhanced method for forming spacers (e.g., 21, 13) or layers (e.g., 25) (or other structures) from TEOS or other organometallic precursors which have a high wet etch rate compared to features formed by more conventional processes (e.g., 11, 15, or 28). In general, it is desired that layers, such as layer 25 in FIG. 3, and spacers, such as spacer 21 in FIG. 2 or spacer 13 in FIG. 1, have a high wet etch rate in HF solutions. Preferably, as mentioned before, the wet etch rate should be at least ten times faster than that of silicon dioxide formed by conventional processes. Furthermore, since, generally speaking, layers, such as layer 25 or spacers 21 or 13 are not extremely thick, it is desirable that the layers from which they are formed have relatively low but stable and reproducible deposition rates. Other desirable features are uniformity of layer thickness across the wafer, good layer conformality, and low layer stress.

Illustratively, apparatus from which disposable spacer layers may be formed includes a reactor such as that manufactured by Applied Materials Corporation, Santa Clara, Calif., and commonly designated AME 5000. A general description of such a reactor is included in U.S. Pat. Nos. 4,892,753 and 4,872,947, issued to Wang et al., and incorporated herein by reference. Generally speaking, such a reactor includes essentially parallel electrodes between which a radio frequency plasma is performed. An upper electrode, often termed a "shower head" is excited with radio frequency energy, typically 13.56 MHz from a radio frequency source. The shower head has holes and serves to direct precursor gases and carrier gases into the plasma whence the reaction products are deposited upon the wafer. A lower electrode is grounded and supports the silicon wafer which includes whatever substrate upon which the silicon dioxide deposition is to be made. Typically, silicon dioxide for deposition from the plasma may be obtained from a gaseous tetraethoxysilane (TEOS) derived from a heated liquid source and transported in a carrier gas, typically helium. The lower electrode (termed a susceptor) is heated by a plurality of lamps, thus controlling the temperature of the substrate upon which deposition is to be accomplished. The entire apparatus is enclosed within a chamber within which a wide variety of pressure environments may be created. The spacing between the wafer and the shower head is adjustable.

Applicants have discovered that when the RF input power, wafer temperature, chamber pressure, spacing, and TEOS/oxygen flow rate ratio are varied from those customarily accepted for producing TEOS layers, that a TEOS layer with a high wet etch rate may be obtained.

In particular, applicant has found that a pressure of $3\pm 2$ Torr (compared to a commonly-used pressure of 10 Torr), a conventionally-defined power density of approximately 2.2 watts/centimeter$^2$ maximum (as opposed to a standardly-used power density of 2.8 watts/centimeter$^2$), and a shower-head-susceptor spacing of 500 mils (as opposed to a standard spacing of 180 mils), and a TEOS/oxygen flow ratio of 0.56 (as opposed to a standard flow ratio of 0.89) produces a TEOS film with a desirable high wet etch rate. Applicant's investigations are summarized below.

In general, applicant studied RF input power densities between 0.4 and 3.6 watts/centimeter$^2$, with other process parameters kept at standard conditions. Generally, the wet etch rate of the resulting TEOS-based layer in HF solutions increased monotonically from 55 to 305 Å per minute when the power density decreased from 3.6 to 0.4 watts/centimeter$^2$. However, reduction of the RF input power alone produced deposition rates of between 120 and 150 Å per second. A more desirable deposition rate for layers of approximately 3000 Å thickness (a typical thickness for spacer formation) is 60-80 Å per second. Thus, although a decrease in the input power density seems to yield layers with higher wet etch rates, a change in input power alone may not be sufficient to produce a layer with the desired properties.

Applicant's analysis suggests that the lower input power density mentioned above provides a less complete dissociation of the fairly complex TEOS molecules in the plasma. Consequently, the as-deposited silicon oxide layer contains a comparatively large number of impurities such as Si-OH bonds. These impurities tend to make the layer more soluble in various HF solutions.

Applicant has found that the incomplete dissociation mentioned above may be further enhanced by reducing the pressure, increasing the susceptor-shower head spacing, and (if desired, or necessary) reducing the substrate temperature. Both reduced pressure and larger susceptor-shower head spacing tend to create a plasma with a larger volume. Consequently, for a given RF input power, the "effective" RF input power density (i.e., volumetric power density) decreases when either pressure is reduced or spacing is increased. Applicant's investigations have shown that the wet etch rate of the resulting TEOS-based layer in 8/1 ethylene glycol buffered HF solutions increases at wider susceptor-shower head spacing (greater than or equal to 300 mils) when the pressure decreases. Furthermore, when the chamber pressure is reduced from approximately 10 to 3 Torr, the deposition rate is reduced from 120 to 75 Å/second. Furthermore, at low pressure such as approximately 3 Torr, the deposition rate seems to remain relatively constant when electrode spacing changes.

Another factor which applicant believes contributes to the desired incomplete dissociation of the organometallic precursor (TEOS) molecule is the wafer temperature. In general, as the temperature decreases from a generally standard value of 390° C. to approximately 200° C., the incomplete dissociation phenomenon is enhanced. However, applicant has also observed that the deposition rate may tend to increase significantly. As a practical matter, it may be desirable to maintain the wafer temperature at approximately the same value (i.e., 390° C.) as is used in other TEOS deposition processes. Maintaining the wafer temperature at the same temperature as is used for other processes enhances manufacturability since the same machine can be used for multiple processes.

Finally, applicant has also investigated the effects of the TEOS/oxygen flow rate ratio when the susceptor-shower head spacing is increased to 500 mils, and input power, chamber pressure, and temperature are maintained at approximately 2.8 watts/centimeter$^2$, 3 Torr, at 390° C., respectively. Reduction on the TEOS/oxygen flow rate ratio from approximately 0.89 to approximately 0.56 improves the (i.e., reduces) the deposition rate to nearly 60 Å/second.

While the above discussion has somewhat emphasized the use of TEOS in a reactor, which may, for example, be provided by Applied Materials Corporation, applicant's invention is not so limited. The principles are also applicable to other machines using one or more wafers spaced apart from the shower head and employing a plasma, such as machines manufactured by Novellus. The inventive principles discussed above are applicable to the use of other organometallic precursors including TMOS (tetramethyloxysilane, Si(OCH)$_4$), DADBS (diacetoxyditertiarybutoxysilane, C$_{10}$H$_{26}$O$_4$Si), TMCTS (tetramethylcyclotetrasilane), sold under the trademark "TOMCATS" by J. C. Schumacher, a unit of Air Products and Chemicals, Inc.

In particular applications, all of the above parameters need to not necessarily be varied from standard values; a subset of the parameters of pressure, power density, temperature, shower-head-susceptor spacing; and TEOS/oxygen flow ratio may be chosen and varied in the manner described above to produce a desired layer.

In addition to the processes described above, other modifications may be incorporated to produce layers with high wet etch rates. A dopant such as phosphorous (from phosphine, trimethylphosphite, triethylphosphite), or fluorine (from nitrogen trifluoride), or boron (from trimethylborate) may be added to the reactor during TEOS decomposition to produce layers with even higher wet etch rates. The phosphorous or fluorine may be added in situations in which there is no fear of contaminating adjacent layers with these dopants. An advantage of the process initially disclosed is that it does not utilize dopants such as phosphorous or fluorine and therefore poses no risk of adjacent layer contamination.

I claim:

1. A method of semiconductor fabrication comprising:
    forming a first layer of silicon oxide upon a substrate having a raised topographic feature, said formation process being accomplished in a reactor having a susceptor supporting said substrate and having a shower head spaced a predetermined distance from said susceptor, said shower head dispensing a mixture of TEOS and oxygen together with an inert gas, said reactor further having confinement means for maintaining a desired pressure and having means for heating said wafer to a predetermined temperature and having means for striking a plasma between said susceptor and said shower head, said plasma having a power density, said first layer being formed by maintaining said power density at approximately 2.8 watts/centimeter$^2$; said distance between said shower head and said susceptor being approximately 180 mils; said pressure being maintained at 10 Torr; and the flow rate of said TEOS to said oxygen being approximately 0.89;
    forming a second layer rich in silicon oxide upon said first layer, said second layer being formed in the same or similar reactor but having a power density maintained at approximately 2.2 watts/centimeter$^2$; a distance between said shower head and said susceptor of approximately 500 mils; a pressure of approximately 3 Torr; and a flow rate of TEOS to said oxygen of approximately 0.56;
    anisotropically etching said second layer in the vicinity of said raised topographic feature to create a spacer with curved side;
    subsequently etching said spacer in a solution containing HF.

2. The method of claim 1 further including the step of anisotropically etching said first layer to create a second spacer with a curved side prior to deposition of said second layer.

3. A method if semiconductor integrated circuit formation, comprising:
    forming a first material layer; and
    forming a second material layer upon said first material layer, the second material layer being formed by a vapor deposition process using reaction chamber pressure, power density and precursor gas-to-oxygen flow rate values selected to result in incomplete dissociation of the precursor gas using values for at least two of the three above parameters selected to produce impurities which are incorporated in said second material layer in sufficient number that said second material layer exhibits a substantially higher etch rate than said first material layer.

4. The method of claim 3, further comprising the steps of selectively etching the second material layer relative to the first material layer.

5. The method of claim 3, wherein the pressure is maintained at 3±2 Torr.

6. The method of claim 3, wherein the power density is between 0.4 and about 2.2 watts per square centimeter.

7. The method of claim 3, wherein the precursor gas-to-oxygen flow rate ratio is 0.56±0.2.

8. The method of claim 3, in which a dopant chosen from the group consisting of phosphorous, boron, and fluorine is added to said second material layer.

9. The method of claim 3, wherein the first material layer is an oxide of silicon.

10. The method of claim 3, in which the precursor gas is chosen from the group consisting of TEOS, TMOS, DADBS, TMCTS.

11. The method of claim 3, further comprising the step of maintaining reaction chamber temperature between 200° C. and 390° C.

12. The method of claim 3 in which said second material layer is anisotropically etched to create a spacer with a curved side.

13. The method of claim 12 in which said spacer is subsequently etched in a solution containing HF.

14. The method of claim 12 further including the step of anisotropically etching said first material layer to create a second spacer with a curved side prior to deposition of said second material layer.

15. The method of claim 3 in which said second material is formed upon a wafer in a reactor, said reactor having a susceptor supporting said wafer and having a shower head being spaced a predetermined distance from said susceptor, between 300 and 500 mils, and having means for heating said wafer to a predetermined temperature and having confinement means for maintaining a desired pressure, and having means for creating a plasma between said susceptor and said shower head, said plasma having a power density, said power density being maintained so that there is significant incomplete dissociation of said precursor gas within said plasma, thus producing impurities, and so that second material layer contains sufficient impurities to have a wet etch rate at least ten times higher than a layer without said impurities.

16. The method of claim 15, further comprising the step of anisotropically etching said second material layer to form a spacer with a curved side.

17. A method of semiconductor integrated circuit formation, comprising:
    forming a first material layer upon a substrate; and
    forming a second material layer upon said first material layer, the second material layer being formed by a vapor deposition process using reaction chamber pressure, power density and organometallic precursor-to-oxygen gas flow rate values selected to result in incomplete dissociation of the precursor gas by using values for at least two of the three above parameters selected to produce impurities which are incorporated in said second material layer in sufficient number that said second material layer exhibits a substantially higher etch rate than said first material layer.

18. The method of claim 17, in which a dopant chosen from the group consisting of phosphorus, boron, and fluorine is added to said second material layer.

19. The method of claim 17, in which the organometallic precursor gas is chosen from the group consisting of TEOS, TMOS, DADBS, TMCTS.

20. The method of claim 17, wherein the pressure is maintained at 3±2 Torr.

21. The method of claim 17, wherein the power density is between 0.4 and about 2.2 watts per square centimeter.

22. The method of claim 17, wherein the precursor gas-to-oxygen flow rate ratio is 0.56±0.2.

23. The method of claim 17, further comprising the step of maintaining reaction chamber temperature between 200° C. and 390° C.

24. The method of claim 17 in which said second material layer is anisotropically etched to create a spacer with a curved side.

25. The method of claim 24 in which said spacer is subsequently etched in a solution containing HF.

26. The method of claim 17 further including the step of anisotropically etching said first material layer to create a second spacer with a curved side prior to deposition of said second material layer.

* * * * *